(12) United States Patent
Takano (10) Patent No.: US 8,268,077 B2
(45) Date of Patent: Sep. 18, 2012

(54) UPPER HEATER, SINGLE CRYSTAL PRODUCTION APPARATUS, AND METHOD FOR PRODUCING SINGLE CRYSTAL

(75) Inventor: Kiyotaka Takano, Nishishirakawa (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 13/128,978

(22) PCT Filed: Oct. 8, 2009

(86) PCT No.: PCT/JP2009/005234
§ 371 (c)(1),
(2), (4) Date: May 12, 2011

(87) PCT Pub. No.: WO2010/064354
PCT Pub. Date: Jun. 10, 2010

(65) Prior Publication Data
US 2011/0214604 A1    Sep. 8, 2011

(30) Foreign Application Priority Data

Dec. 5, 2008 (JP) .................................. 2008-310433

(51) Int. Cl.
*C30B 15/14* (2006.01)
(52) U.S. Cl. ............... 117/217; 117/11; 117/13; 117/30; 117/31; 117/32; 117/33; 117/34; 117/35; 117/200; 117/204; 117/206; 117/208
(58) Field of Classification Search ..................... 117/11, 117/13, 30–35, 200, 204, 206, 208, 217
See application file for complete search history.

(56) References Cited

U.S. PATENT DOCUMENTS

| 5,087,429 | A | | 2/1992 | Kamio et al. |
| 5,766,346 | A | | 6/1998 | Hayashi et al. |
| 5,792,255 | A | * | 8/1998 | Iino et al. ......................... 117/32 |
| 5,935,326 | A | | 8/1999 | Kotooka et al. |
| 6,007,625 | A | * | 12/1999 | Tomioka et al. ............... 117/217 |

(Continued)

FOREIGN PATENT DOCUMENTS

JP    02-059494    *    2/1990

(Continued)

OTHER PUBLICATIONS

International Search Report dated Dec. 15, 2009 in corresponding International Application No. PCT/JP2009/005234.

*Primary Examiner* — Michael Kornakov
*Assistant Examiner* — Kenneth A Bratland, Jr.
(74) *Attorney, Agent, or Firm* — Oliff & Berridge, PLC (57) ABSTRACT

An upper heater for use in the production of a single crystal, the upper heater having electrodes to which a current is supplied and a heat generating section which generates heat by resistance heating are provided, the upper heater being used when a single crystal is produced by a Czochralski method, the upper heater being placed above a graphite heater which is placed so as to surround a crucible containing silicon melt, wherein the heat generating section is ring-shaped and is placed so as to surround the crucible, and has slits formed from the inside and the outside of the heat generating section in a horizontal direction. As a result, the upper heater controls a crystal defect of the single crystal efficiently and improves the oxygen concentration controllability.

16 Claims, 9 Drawing Sheets

U.S. PATENT DOCUMENTS

| | | | |
|---|---|---|---|
| 6,285,011 B1 * | 9/2001 | Cherko | 219/426 |
| 7,524,371 B2 * | 4/2009 | Yokoyama et al. | 117/14 |
| 2007/0215038 A1 * | 9/2007 | Iida et al. | 117/217 |

FOREIGN PATENT DOCUMENTS

| | | |
|---|---|---|
| JP | A-2-59494 | 2/1990 |
| JP | A-5-294782 | 11/1993 |
| JP | A-6-183876 | 7/1994 |
| JP | A-9-183691 | 7/1997 |
| JP | A-10-152389 | 6/1998 |
| JP | A-2001-39792 | 2/2001 |
| JP | A-2001-261482 | 9/2001 |
| JP | A-2005-53722 | 3/2005 |

* cited by examiner

PRIOR ART

FIG.9

PRIOR ART

UPPER HEATER, SINGLE CRYSTAL PRODUCTION APPARATUS, AND METHOD FOR PRODUCING SINGLE CRYSTAL

TECHNICAL FIELD

The present invention relates to an upper heater for use in the production of a single crystal, the upper heater which is used when a single crystal is produced by Czochralski method; single crystal production equipment using the same; and a method for producing a single crystal.

BACKGROUND ART

There is a silicon single crystal, for example, as a single crystal used as a substrate of a semiconductor device, and the silicon single crystal is produced mainly by Czochraiski method (hereinafter abbreviated as CZ method).

Figure 8:
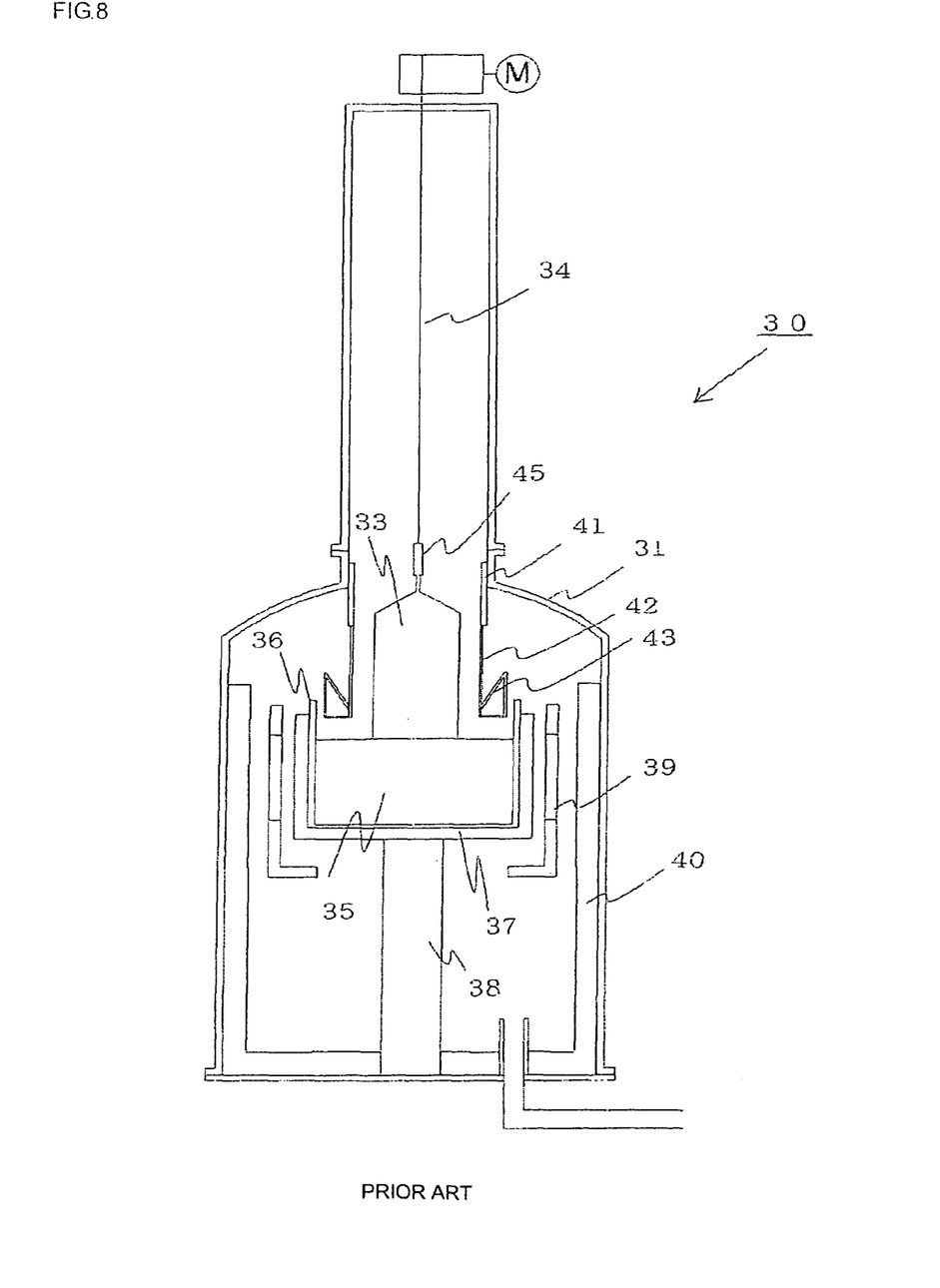
FIG. 8 is a diagram showing single crystal production equipment using a conventional single-stage heater.

When a single crystal is produced by CZ method, single crystal production equipment 30 shown in FIG. 8, for example, is used. This single crystal production equipment has a main chamber 31 in which a crucible is placed at the center thereof. The crucible has a double structure and is formed of a quartz crucible 36 and a graphite crucible 37, which holds the outside of the quartz crucible.

These crucibles are secured to the upper end of a shaft 38 in such a way that the crucibles can rotate and move up and down, and a graphite heater 39 is placed outside the crucible. Furthermore, insulating material 40 is placed concentrically around the outside of the graphite heater. In addition, silicon melt 35, which is silicon raw material melted by the graphite heater, is contained the quartz crucible.

Moreover, a wire 34 which rotates at a predetermined rate on the same axis as the shaft in a direction opposite to the shaft or in the same direction as the shaft is placed on the central axis of the quartz crucible filled with the silicon melt, and a seed crystal 45 is held at the lower end of the wire. In addition, a single crystal 33 is formed at a lower end face of the seed crystal.

Furthermore, a cooling cylinder 41 to cool the single crystal which has been pulled upwardly and, in the lower part thereof, a graphite cylinder 42 are provided, whereby the single crystal which has been pulled upwardly can be cooled by passing coolant gas through the cylinders downward. In addition, a thermal shield 43 is provided outside the lower end of the graphite cylinder to intercept radiation from the surface of the melt and keep the heat on the surface of the silicon melt.

Moreover, equipment in which, in addition to a graphite heater, a heater for melting silicon raw material is placed in order to shorten the single crystal production time has been disclosed (see, for example, Japanese Patent Laid-Open (kokai) No. H6-183876). However, since this heater is placed immediately above the silicon melt in a position above the graphite heater, dislocation is undesirably generated in the single crystal as a result of dust falling on the single crystal during the growth of the single crystal. Furthermore, when the SiO gas evaporated from the silicon melt attaches to this upper heater, the graphite gradually degrades due to silicification. This undesirably increases the carbon concentration in the single crystal.

Figure 9:
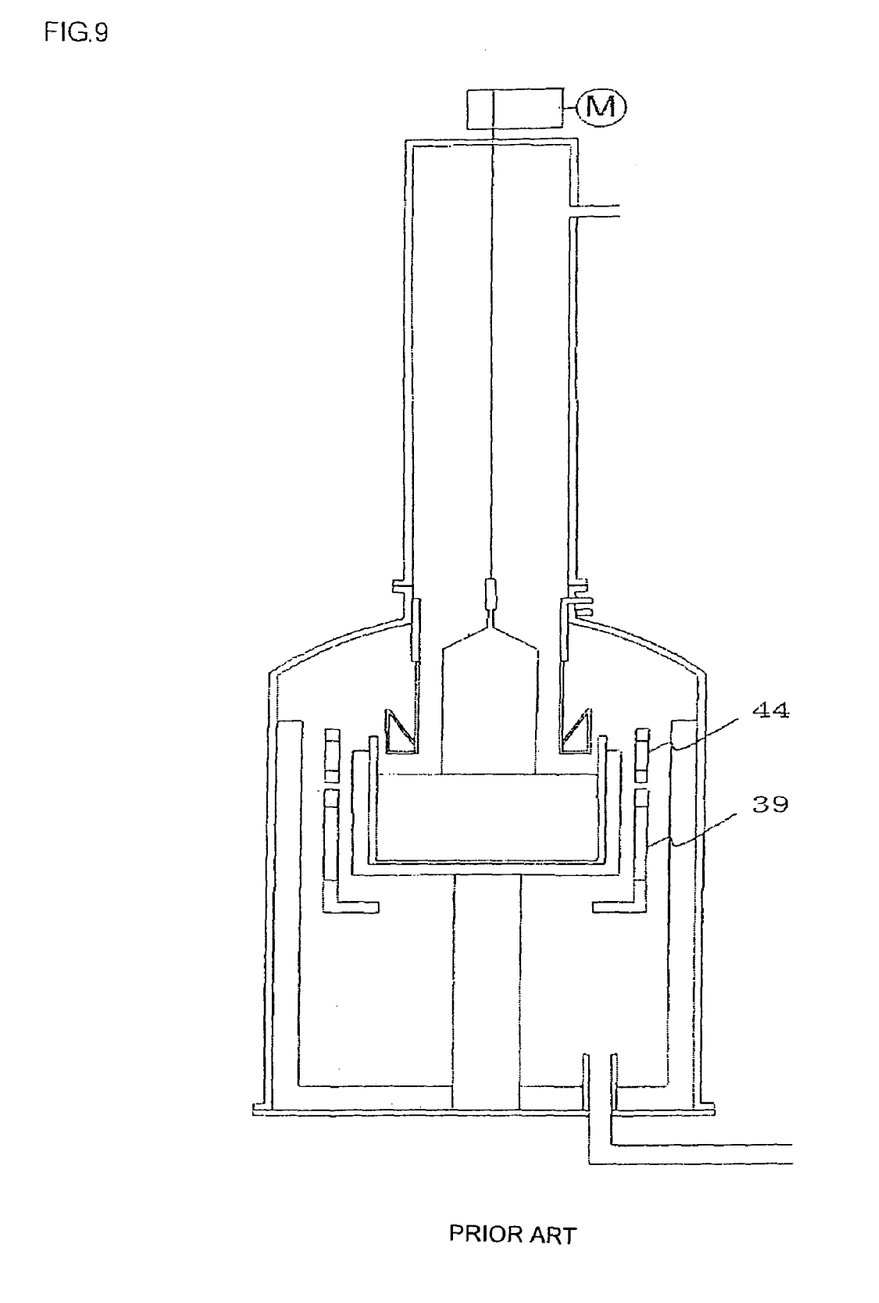
FIG. 9 is a diagram showing single crystal production equipment using a conventional two-stage heater.

In addition, a method for controlling a crystal defect by controlling the ratio of power between the upper and lower heaters by providing a graphite heater with a two-stage structure as shown in FIG. 9 and placing, above a conventional graphite heater 39, a cylindrical heater 44 having the same inside and outside diameters as those of the graphite heater 39 has also been disclosed (see, for example, Japanese Patent Laid-Open (kokai) No. 2001-261482).

In this case, the specific resistance of graphite is 1000 to 1500 $\mu\Omega$cm, which is extremely low, at room temperature and it is hard to produce heat in this state, it is necessary to form a zigzag current path by forming slits in several points in the upper and lower edges in a circumferential direction. However, when a static magnetic field is applied by a superconducting coil or the like, the heater is deformed by the Lorentz force. Therefore, it is necessary to prevent deformation by maintaining strength and thereby prevent discharge between the heater and the other graphite parts. As a result, there are limitations to shorten drastically the length of the upper and lower ends in which the slits do not cross each other.

Thus, when the heat generation center of the upper heater is placed near a growth interface of the single crystal, the lower edge of the upper heater is lower than the melt surface, and the position of the lower heater is lower than the silicon melt as compared to the single-stage heater shown in FIG. 8. This makes it difficult to perform control as a result of an increase in oxygen concentration in the crystal. Moreover, the former half of a straight body has large G, and it is difficult to control the value of V/G so as to be a value at which target crystal quality can be obtained.

Here, V/G is a ratio between a pulling rate V and a crystal solid-liquid interface temperature gradient G and is a parameter which can control two types of point defects, vacancies and interstitial silicon, and has received attention as a control factor of Grown-in defects and oxygen precipitation characteristics. By adjusting the pulling rate V and the crystal solid-liquid interface temperature gradient G so as to make the V/G value constant, it is possible to pull a single crystal upwardly in an N region on the entire plane in which a defect region is removed from a radial direction of the single crystal.

SUMMARY OF INVENTION

An object of the present invention is to provide an upper heater for use in the production of a single crystal, the upper heater which can control a crystal defect of a single crystal efficiently, and single crystal production equipment and a method for producing a single crystal, the equipment and the method which can produce a high-quality single crystal by controlling a crystal defect efficiently and improving the oxygen concentration controllability by using the upper heater for use in the production of a single crystal.

In order to solve the above problems, the present invention provides an upper heater for use in the production of a single crystal, the upper heater in which at least electrodes to which a current is supplied and a heat generating section which generates heat by resistance heating are provided, the upper heater being used when a single crystal is produced by Czochralski method, the upper heater being placed above a graphite heater which is placed so as to surround a crucible containing silicon melt, wherein the heat generating section is ring-shaped and is placed so as to surround the crucible, and has slits formed from the inside and the outside of the heat generating section in a horizontal direction.

As described above, since the heat generating section is ring-shaped and is placed so as to surround the crucible, and has slits formed from the inside and the outside of the heat generating section in a horizontal direction, it is possible to form a plate-like heat generating section with a thickness of 30 mm or less, for example, and make the heat generating section extremely thin as compared to a conventional one. This makes it possible to provide an upper heater for use in the production of a single crystal, the upper heater which can concentrate a heat generation distribution locally in a vertical direction. As a result, it is possible to reduce the thermal influence on the convection of the silicon melt by the upper heater and produce a high-quality single crystal by controlling a crystal defect efficiently.

In this case, it is preferable that the upper heater have, in addition to the electrodes, dummy electrodes placed so as to support the heat generating section of the upper heater from below, the dummy electrodes each being placed in a position at an angle of 90 degrees from the electrodes in a circumferential direction.

As described above, since the upper heater has, in addition to the electrodes, dummy electrodes placed so as to support the heat generating section of the upper heater from below, the dummy electrodes each being placed in a position at an angle of 90 degrees from the electrodes in a circumferential direction, it is possible to prevent the heat generating section from being deformed by the weight of the upper heater itself or external forces. Therefore, it is possible to provide an upper heater for use in the production of a single crystal, the upper heater which can prevent from discharging or being broken down as a result of the upper heater being too close to the other part, for example, a graphite heater which is placed in the lower part.

In this case, it is preferable that the heat generating section be formed of carbon fiber composite material.

As described above, since the heat generating section is formed of carbon fiber composite material, it is possible to use material with higher bending strength than isotropic graphite, which has been conventionally used. This makes it possible to provide an upper heater for use in the production of a single crystal, the upper heater which can be made thinner.

Moreover, it is preferable that the heat generating section be formed by making the width of the slits on the inside different from the width of the slits on the outside to make a heat generation distribution of the heat generating section have an intended value.

As described above, since the heat generating section is formed by making the width of the slits on the inside different from the width of the slits on the outside to make a heat generation distribution have an intended value, it is possible to make, for example, the heat generating section produce a larger amount of heat in the inside thereof than the outside thereof. This makes it possible to provide an upper heater for use in the production of a single crystal, the upper heater which can reliably concentrate a heat generation distribution locally in a vertical direction.

Furthermore, in the upper heater of the present invention for use in the production of a single crystal, it is preferable that, when a single crystal is produced by the horizontal magnetic field applying CZ method which pulls a single crystal upwardly while applying a horizontal magnetic field to the silicon melt by a magnetic field applying apparatus, the electrodes of the upper heater to which a current is supplied be placed in vertical positions with respect to a direction of a magnetic line connecting the coil's centers of the horizontal magnetic field applied from the magnetic field applying apparatus, and the polarities of the electrodes be disposed such that the upper heater experiences downward forces from the horizontal magnetic field.

As described above, since, when a single crystal is produced by the horizontal magnetic field applying CZ method which pulls a single crystal upwardly while applying a horizontal magnetic field to the silicon melt by a magnetic field applying apparatus, the electrodes of the upper heater are placed in vertical positions with respect to a direction of a magnetic line connecting the coil's centers of the horizontal magnetic field applied from the magnetic field applying apparatus, and the polarities of the electrodes are disposed such that the upper heater experiences downward forces from the horizontal magnetic field, it is possible to exert the force on the upper heater vertically downward. This makes it possible to prevent deformation of the heat generating section by supporting the upper heater from below.

In addition, the present invention provides single crystal production equipment provided with at least the upper heater for use in the production of a single crystal, the upper heater which is any one of the above.

As described above, since the single crystal production equipment is provided with the upper heater for use in the production of a single crystal, the upper heater which is any one of the above, the single crystal production equipment can be provided as equipment which can reduce the thermal influence on the convection of the silicon melt by the upper heater and produce a high-quality single crystal by controlling a crystal defect efficiently.

In this case, it is preferable that the single crystal production equipment include at least: a crucible containing the silicon melt; a cooling cylinder cooling a single crystal pulled upwardly from the crucible; and a thermal shield which keeps the heat on the surface of the silicon melt and is placed so as to face the silicon melt, the thermal shield being placed outside a lower end of a graphite cylinder provided in a lower part of the cooling cylinder, wherein the upper heater is placed in such a way that the bottom face of the upper heater is above the surface of the silicon melt during the growth of the single crystal and the top face of the upper heater is below the bottom of the thermal shield.

As described above, since the upper heater is placed in such a way that the bottom face of the upper heater is above the surface of the silicon melt during the growth of the single crystal and the top face of the upper heater is below the bottom of the thermal shield, the single crystal production equipment can be provided as single crystal production equipment which can enhance efficiency of heat transfer to the side of the single crystal and reduce the thermal influence on the silicon melt by the upper heater. Moreover, it is possible to place the graphite heater placed in the lower part of the upper heater in an upper position as compared to the conventional position and place the heat generation center of the graphite heater in an upper position to the silicon melt as compared to the conventional position. This makes it possible to provide single crystal production equipment, which can produce a high-quality single crystal by controlling a crystal defect efficiently and improving oxygen concentration controllability.

Furthermore, it is preferable that the single crystal production equipment include at least a magnetic field generating apparatus applying a horizontal magnetic field to the silicon melt and produce a single crystal by the horizontal magnetic field applying CZ method which pulls the single crystal upwardly while applying the horizontal magnetic field by the magnetic field generating apparatus.

As described above, since the single crystal production equipment includes at least a magnetic field generating apparatus applying a horizontal magnetic field to the silicon melt and is used when a single crystal is produced by the horizontal magnetic field applying CZ method which pulls the single crystal upwardly while applying the horizontal magnetic field by the magnetic field generating apparatus, it is possible to provide equipment which can produce a single crystal by reliably suppressing the convection of the silicon melt and controlling a crystal defect more efficiently.

Moreover, the single crystal production equipment of the present invention can be used when a large-diameter single crystal with a diameter of 300 mm or more is produced.

As described above, by being used when a large-diameter single crystal with a diameter of 300 mm or more is produced, the equipment can be provided as equipment, which can produce a large-diameter and high-quality single crystal.

In addition, the present invention provides a method for producing a single crystal, the method by which a single crystal is produced by Czochralski method by using the single crystal production equipment provided with at least the upper heater for use in the production of a single crystal, the upper heater which is any one of the above.

As described above, by producing a single crystal by Czochralski method by using the single crystal production equipment provided with the upper heater of the present invention for use in the production of a single crystal, it is possible to produce a high-quality single crystal whose crystal defect is efficiently suppressed and oxygen concentration is controlled with a high degree of precision.

In this case, in a method for producing a single crystal by Czochralski method by using single crystal production equipment comprising at least: a crucible containing the silicon melt; a cooling cylinder cooling a single crystal pulled upwardly from the crucible; and a thermal shield which keeps the heat on the surface of the silicon melt and is placed so as to face the silicon melt, the thermal shield being placed outside a lower end of a graphite cylinder provided in a lower part of the cooling cylinder, the single crystal production equipment in which the upper heater is placed in such a way that the bottom face of the upper heater is above the surface of the silicon melt during the growth of the single crystal and the top face of the upper heater is below the bottom of the thermal shield, it is preferable that a straight body of the single crystal with a constant diameter be formed by pulling the single crystal upwardly, and then the power of the upper heater be gradually reduced until an upper part of the straight body reaches a lower end part of the cooling cylinder.

As described above, by forming a straight body by pulling a single crystal upwardly and gradually reducing the power of the upper heater until the upper part of the straight body reaches the lower end part of the cooling cylinder, it is possible to prevent a sudden reduction in temperature gradient in the single crystal caused by a reduction in temperature gradient near a crystal interface of the former half of the straight body and stabilize the pulling rate from the former half of the straight body. This makes it possible to control V/G with a high degree of precision. As a result, it is possible to produce a higher-quality single crystal, which is controlled to have stable quality.

As described above, in the upper heater of the present invention for use in the production of a single crystal, the heat generating section is ring-shaped and is placed so as to surround the crucible, and has slits formed from the inside and the outside of the heat generating section in a horizontal direction. This makes it possible to reduce the thermal influence on the convection of the silicon melt by the upper heater and produce a single crystal by controlling a crystal defect efficiently. In addition, with the single crystal production equipment provided with such an upper heater for use in the production of a single crystal, it is possible to suppress a crystal defect efficiently and improve oxygen concentration controllability, whereby it is possible to produce a high-quality single crystal.

BEST MODE(S) FOR CARRYING OUT THE INVENTION

Hereinafter, the present invention will be described more specifically.

As described above, equipment in which a graphite heater for melting silicon raw material has a two-stage structure and is formed of upper and lower heaters has been disclosed. However, the oxygen concentration in a crystal undesirably increases because the position of the lower heater is lower position to the silicon melt as compared to a conventional single-stage heater structure. Moreover, the former half of a straight body has large G, and it is difficult to control the value of V/G so as to be a value at which target crystal quality can be obtained.

Therefore, the inventors of the present invention conceived of making the height of a heat generating section of the upper heater as low as possible and tried to obtain a heat generating section formed as a plate-like ring having slits in a horizontal direction from inside and outside.

As a result, the inventors could make the thickness of the heat generating section extremely thin, such as 30 mm or less, as compared to a conventional one and concentrate a heat generation distribution locally in a vertical direction.

Moreover, it has been found that, in single crystal production equipment provided with the upper heater, a crucible containing the silicon melt, a cooling cylinder cooling a single crystal pulled upwardly from the crucible, and a thermal shield which keeps the heat on the surface of the silicon melt and is placed so as to face the silicon melt, the thermal shield placed outside the lower end of a graphite cylinder provided in the lower part of the cooling cylinder, it is possible to enhance efficiency of heat transfer to the side of the single crystal, control a crystal defect in the single crystal, and prevent an increase in oxygen concentration by placing the upper heater in such a way that the bottom face of the upper heater is above the surface of the silicon melt during the growth of the single crystal and the top face of the upper heater is below the bottom of the thermal shield.

Furthermore, it has been found that, when a single crystal is produced by using the single crystal production equipment, a single crystal with stable quality can be produced by forming a straight body of a single crystal with a constant diameter by pulling a single crystal upwardly and then gradually reducing the power of the upper heater until the upper part of the straight body reaches the lower end part of the cooling cylinder.

The present invention has been completed based on the above findings and discoveries. Hereinafter, the present invention will be described more detail with reference to the drawings, but the present invention is not limited to what will be described below.

Figure 1:
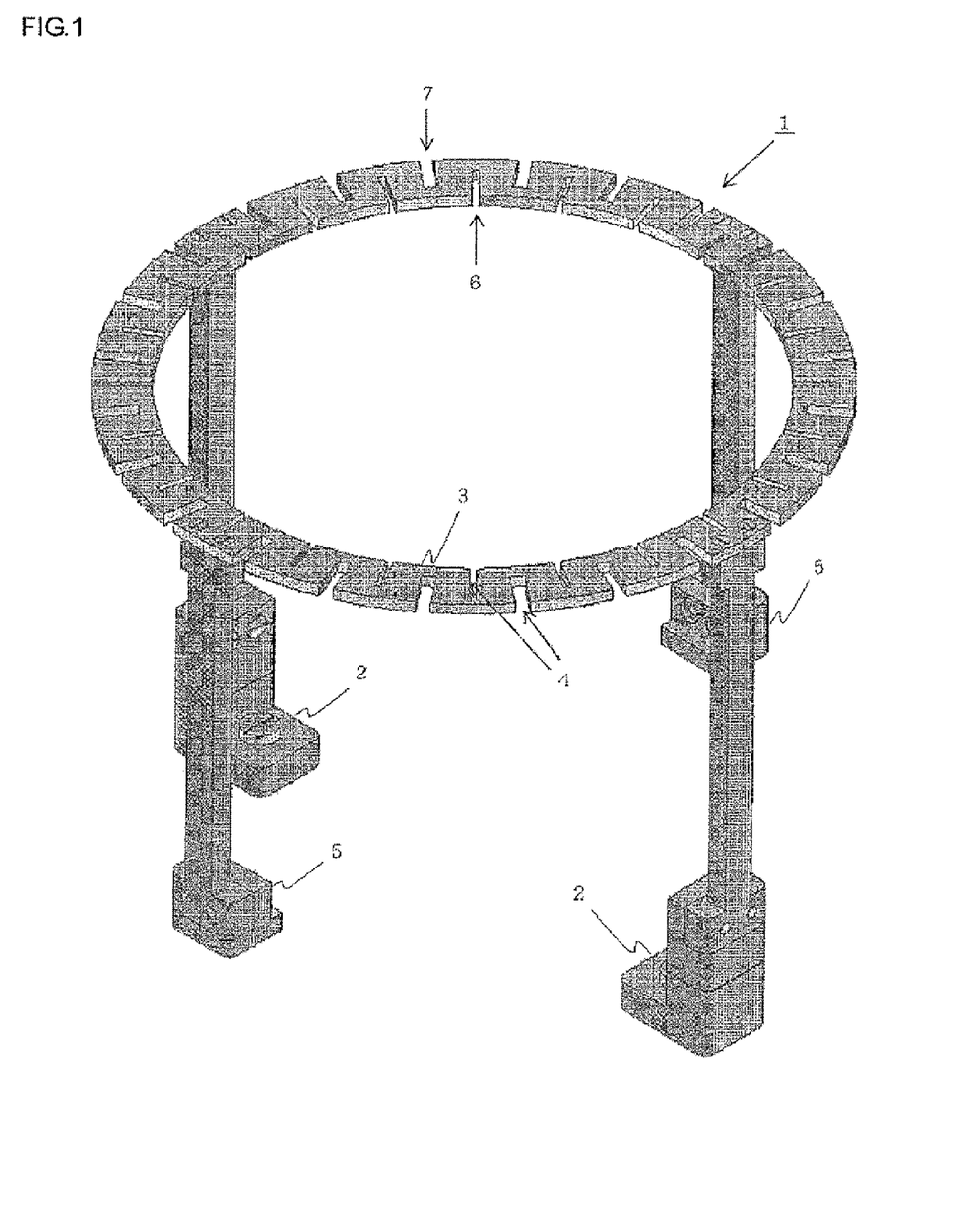
FIG. 1 is a schematic diagram of an upper heater of the present invention for use in the production of a single crystal.

FIG. 1 is a schematic diagram of an upper heater of the present invention for use in the production of a single crystal.

The upper heater 1 for use in the production of a single crystal is provided with two electrodes 2 to which a current is supplied and a heat generating section 3 which generates heat by resistance heating. The heat generating section 3 is shaped like a ring having a thickness of 30 mm or less, for example, and has slits 4 formed from the inside 6 and the outside 7 in a horizontal direction. In this case, the ring-shaped heat generating section of the present invention is shaped like a plate whose width is greater than the thickness thereof.

As described above, it is possible to make the heat generating section extremely thin as compared to a conventional one and concentrate a heat generation distribution locally in a vertical direction. This makes it possible to produce a high-quality single crystal by controlling a crystal defect efficiently.

Moreover, it is preferable that, as shown in FIG. 1, in addition to the electrodes 2, the upper heater 1 for use in the production of a single crystal have two dummy electrodes 5 which are placed so as to support the heat generating section of the upper heater from below, the dummy electrodes 5 each being placed in a position at an angle of 90 degrees from the electrodes 2 in a circumferential direction.

As a result, it is possible to prevent the heat generating section from being deformed by the weight of the heat generating section itself of the upper heater, external forces from a magnetic field, or the like. Therefore, it is possible to provide an upper heater for use in the production of a single crystal, the upper heater which can prevent from discharging or being broken down as a result of the upper heater being too close to the other part, for example, a graphite heater which is placed in the lower part when the upper heater is used in the single crystal production equipment. It goes without saying that the dummy electrodes have to be electrically insulated.

Moreover, it is preferable that the heat generating section 3 be formed of carbon fiber composite material.

This makes it possible to use material with higher bending strength than isotropic graphite, which has been conventionally used and prevent the occurrence of deformation or breakage more reliably even if the heat generating section is made thinner.

Furthermore, it is preferable that the heat generating section 3 be formed by making the width of the slits 4 cut from the inside 6 different from the width of the slits 4 cut from the outside 7 to make the heat generation distribution of the heat generating section have an intended value.

Figure 2:
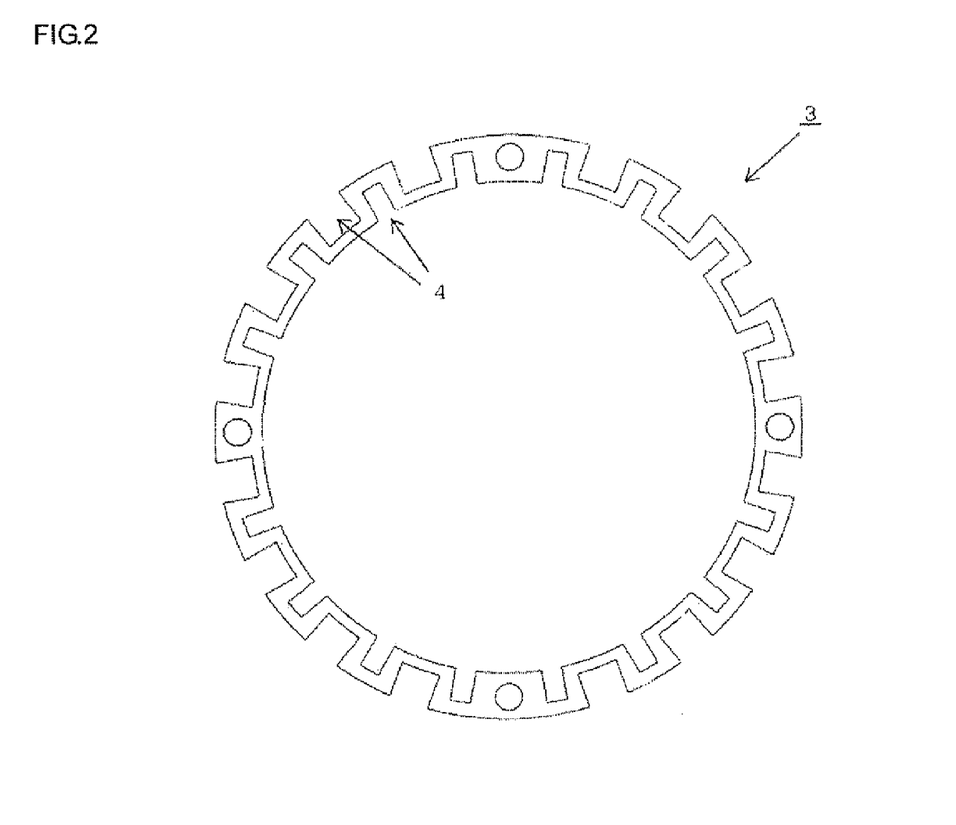
FIG. 2 is a diagram showing an example of slits of a heat generating section of the upper heater of the present invention for use in the production of a single crystal.

Here, in FIG. 2, an example of slits of the heat generating section of the upper heater of the present invention for use in the production of a single crystal is shown. For example, as shown in FIG. 2, by making the width of a slit on the outside of the heat generating section greater than the width of a slit on the inside thereof, it is possible to make the heat generating section produce a larger amount of heat in the inside thereof than the outside thereof. This makes it possible to provide an upper heater for use in the production of a single crystal, the upper heater which can reliably concentrate a heat generation distribution locally in a vertical direction. It goes without saying that, in the present invention, it is possible to make the slits on the inside and the slits on the outside have the same width or make the width of the slits on the inside greater than the width of the slits on the outside in accordance with the purpose.

In addition, it is preferable that, when a single crystal is produced by the horizontal magnetic field applying CZ method which pulls a single crystal upwardly while applying a horizontal magnetic field to the silicon melt by a magnetic field applying apparatus, the electrodes 2 of the upper heater 1 to which a current is supplied be placed in vertical positions with respect to a direction of a magnetic line connecting the coil's centers of the horizontal magnetic field applied from the magnetic field applying apparatus, and the polarities of the electrodes 2 be disposed such that the upper heater experiences downward forces from the horizontal magnetic field.

Figure 3:
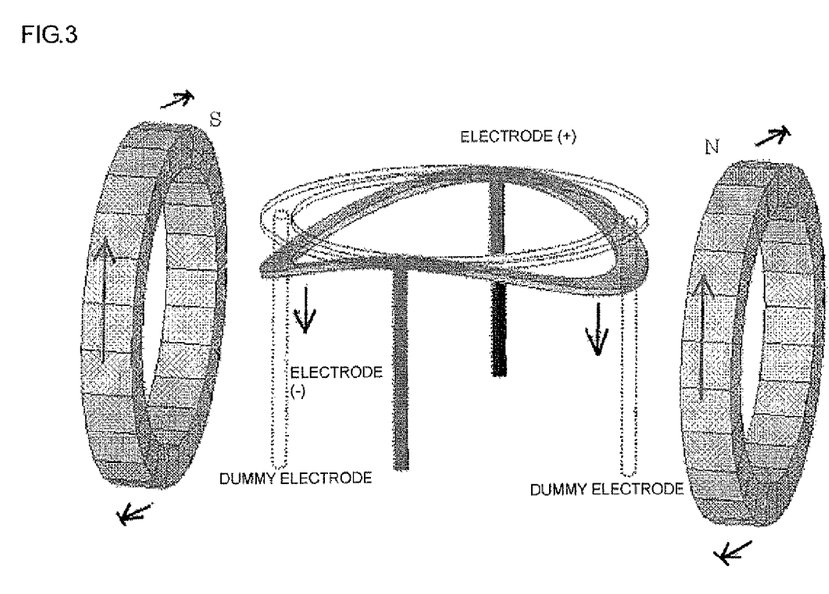
FIG. 3 is a diagram showing how the upper heater is deformed by the force from a horizontal magnetic field.

Here, FIG. 3 shows how the upper heater is deformed by the force from the horizontal magnetic field. As shown in FIG. 3, the polarities of the electrodes are disposed such that the upper heater experiences downward forces from the horizontal magnetic field, whereby it is possible to support the heat generating section of the upper heater from below by using the dummy electrodes, for example. This makes it possible to prevent the heat generating section from being deformed.

Figure 4:
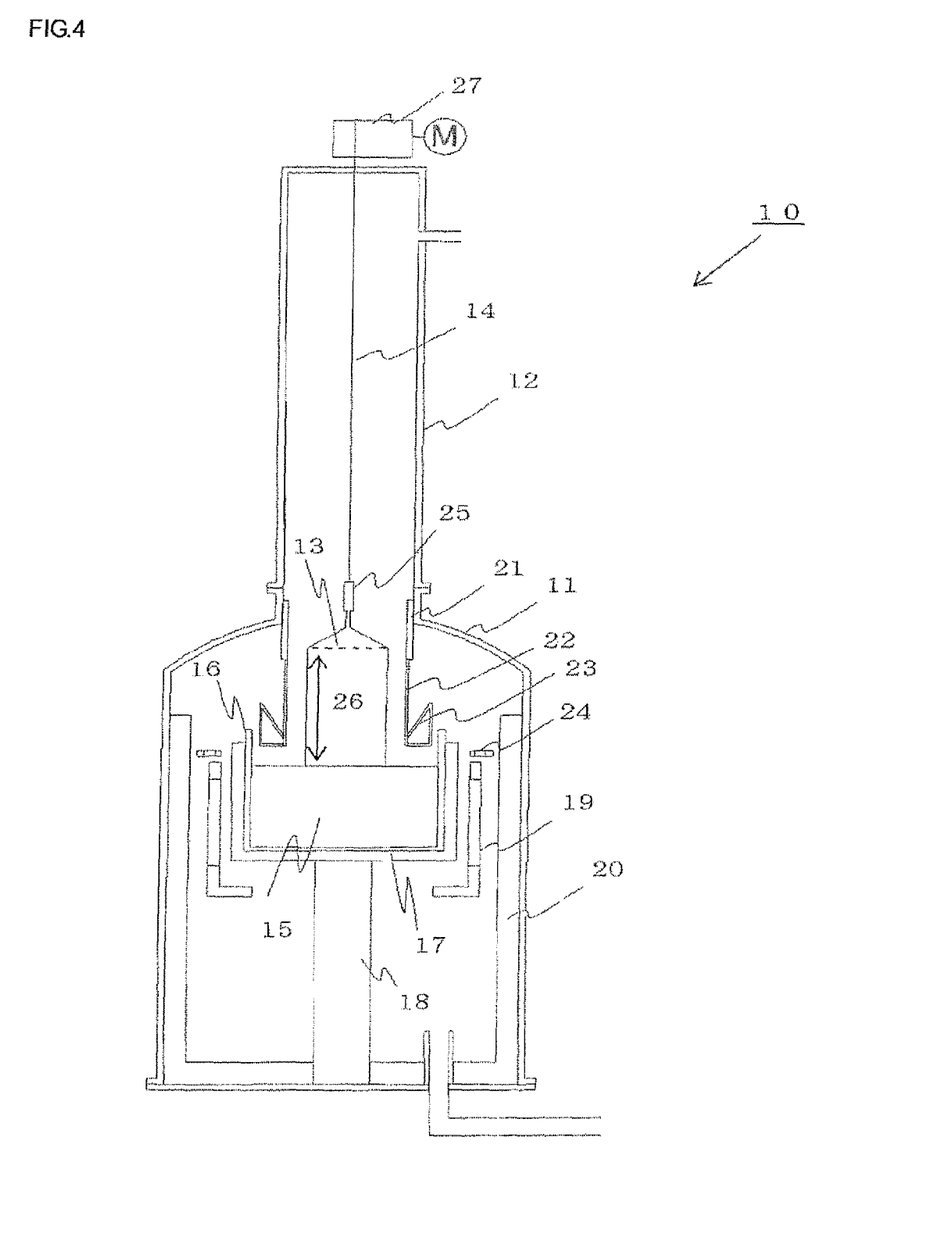
FIG. 4 is a diagram showing single crystal production equipment provided with the upper heater of the present invention for use in the production of a single crystal.

Next, single crystal production equipment provided with the upper heater of the present invention for use in the production of a single crystal is shown in FIG. 4

The single crystal production equipment 10 has a member for melting polycrystalline silicon contained therein, insulating material for heat insulation, and the like, and these members are housed in a main chamber 11. From the ceiling of the main chamber 11, a pull chamber 12 extending upward is connected, and, above the pull chamber 12, a pulling mechanism 27, which pulls a single crystal 13 upwardly by a wire 14, is provided.

Inside the main chamber 11, a quartz crucible 16 containing molten silicon melt 15 and a graphite crucible 17 supporting the quartz crucible 16 are provided, and the crucibles 16 and 17 are supported by a shaft 18 in such a way that the crucibles 16 and 17 can rotate and move up and down.

In addition, a graphite heater 19 for melting silicon raw material is placed so as to surround the crucibles 16 and 17. Insulating material 20 is provided outside the graphite heater 19 in such a way as to surround the graphite heater 19 in order to prevent the heat from the graphite heater 19 from being directly radiated to the main chamber 11.

Moreover, a cooling cylinder 21 which cools the single crystal which has been pulled upwardly and, in the lower part thereof, a graphite cylinder 22 are provided, whereby the single crystal which has been pulled upwardly can be cooled by passing coolant gas through the cylinders downward. In addition, outside the lower end of the graphite cylinder 22, a thermal shield 23 is provided so as to face the silicon melt 15 to intercept radiation from the surface of the melt and keep the heat on the surface of the silicon melt.

Furthermore, the upper heater 24 is placed in such a way that the bottom face of the upper heater is above the surface of the silicon melt during the growth of the single crystal 13 and the top face of the upper heater 24 is below the bottom of the thermal shield 23.

As described above, by placing the upper heater in such a way that the upper heater is above the surface of the silicon melt during the growth of the single crystal and is below the bottom of the thermal shield, it is possible to provide single crystal production equipment which can enhance efficiency of heat transfer to the side of the single crystal.

Moreover, since it is possible to place the graphite heater 19 placed in the lower part of the upper heater 24 in an upper position as compared to the conventional position and place the heat generation center of the graphite heater 19 in an upper position to the silicon melt (in an intended position) as compared to the conventional position, it is possible to facilitate oxygen concentration control and provide single crystal production equipment with improved oxygen concentration controllability. The conventional upper heater is vertically high, and the position in which the graphite heater can be placed is severely limited. However, with a thin, ring-shaped upper heater as in the present invention, almost no restriction is put on the position in which the graphite heater is placed.

In addition, the single crystal production equipment of the present invention is provided with a magnetic field generating apparatus which applies a horizontal magnetic field to the silicon melt, and can be used in producing a single crystal by the horizontal magnetic field applying CZ method which pulls a single crystal upwardly while applying a horizontal magnetic field by the magnetic field generating apparatus.

This makes it possible to provide equipment, which can produce a single crystal by reliably suppressing the convection of the silicon melt and controlling a crystal defect more efficiently.

Furthermore, the single crystal production equipment of the present invention can be used when a large-diameter single crystal with a diameter of 300 mm or more is produced.

This makes it possible to provide equipment, which can produce a large-diameter and high-quality single crystal with a diameter of 300 mm or more by controlling a crystal defect.

In a method of the present invention for producing a single crystal, a single crystal is produced by being pulled upwardly in the manner described below by using the single crystal production equipment 10 shown in FIG. 4.

First, polycrystalline silicon is put into the quartz crucible 16, and the crucible 16 is heated by the graphite heater 19 and the upper heater 24, whereby the polycrystalline silicon in the quartz crucible 16 is melted. In addition, a seed crystal 25 held at the lower end of the wire 14 is immersed in the silicon melt 15 which is the molten polycrystalline silicon, and the seed crystal 25 is then pulled upwardly while being rotated. In this way, a single crystal 13 having an intended diameter and quality is grown below the seed crystal 25.

At this time, it is preferable to form a straight body 26 of the single crystal 13 with a constant diameter and then gradually reduce the power of the upper heater 24 until the upper part of the straight body 26 reaches the lower end part of the cooling cylinder 21 as shown in FIG. 4.

By doing so, since it is possible to prevent a sudden reduction in temperature gradient in the single crystal caused by a reduction in temperature gradient near a crystal interface of the former half of a straight body and stabilize the pulling rate from the former half of the straight body, it is possible to control V/G with a high degree of precision. This makes it possible to produce a higher-quality single crystal, which is controlled to have stable quality.

Next, the present invention will be described more specifically based on examples and comparative examples; however, the present invention is not limited to those examples.

EXAMPLE 1

First, in order to produce a single crystal with a target diameter of 300 mm, the single crystal production equipment 10 shown in FIG. 4 was used, and silicon melt 15 was formed by filling a quartz crucible 16 with an outside diameter of 909 mm with 450 kg of polycrystalline silicon and melting the polycrystalline silicon by applying power to a graphite heater 19 and an upper heater 24. Then, a seed crystal 25 was immersed in the silicon melt 15, and a single crystal 13 was pulled upwardly by being rotated by the wire 14 in a direction opposite to the direction of rotation of the crucibles 16 and 17.

Figure 6:
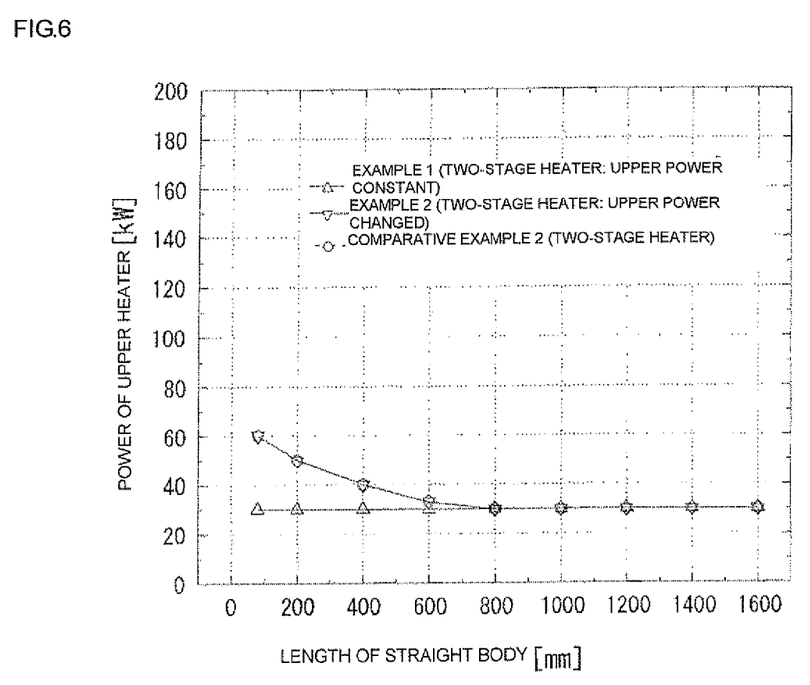
FIG. 6 is a diagram showing the length of a straight body and the power of the upper heater in examples and comparative examples.

At this time, as shown in FIG. 6, the power of the upper heater 24 was maintained constant.

Moreover, the oxygen concentration and the crystal defect of the single crystal thus produced were measured.

EXAMPLE 2

In the growth of the single crystal of Example 1 described above, a straight body 26 was formed, and a single crystal was pulled upwardly while at the same time change control is performed so as to reduce the power of the upper heater 24 gradually as shown in FIG. 6 until the upper part of the straight body 26 reaches the lower end part of the cooling cylinder 21. The oxygen concentration and the crystal defect of the single crystal thus produced were measured.

COMPARATIVE EXAMPLE 1

Unlike Example 1 described above, the single crystal production equipment shown in FIG. 8, the equipment using the conventional single-stage heater, was used, and silicon melt was formed by melting polycrystalline silicon. Thereafter, a seed crystal was immersed in the silicon melt, and a single crystal was pulled upwardly by being rotated by a wire in a direction opposite to the direction of rotation of the crucible. Then, the oxygen concentration and the crystal defect of the single crystal thus produced were measured.

COMPARATIVE EXAMPLE 2

Unlike Example 1 described above, the single crystal production equipment shown in FIG. 9, the equipment using the conventional two-stage heater, was used, and silicon melt was formed by melting polycrystalline silicon. Then, a seed crystal was immersed in the silicon melt, and a single crystal was pulled upwardly by being rotated by a wire in a direction opposite to the direction of rotation of the crucible.

At this time, as shown in FIG. 6, the power of the upper heater was gradually reduced as in Example 2. Moreover, the oxygen concentration and the crystal defect of the single crystal thus produced were measured.

Figure 5:
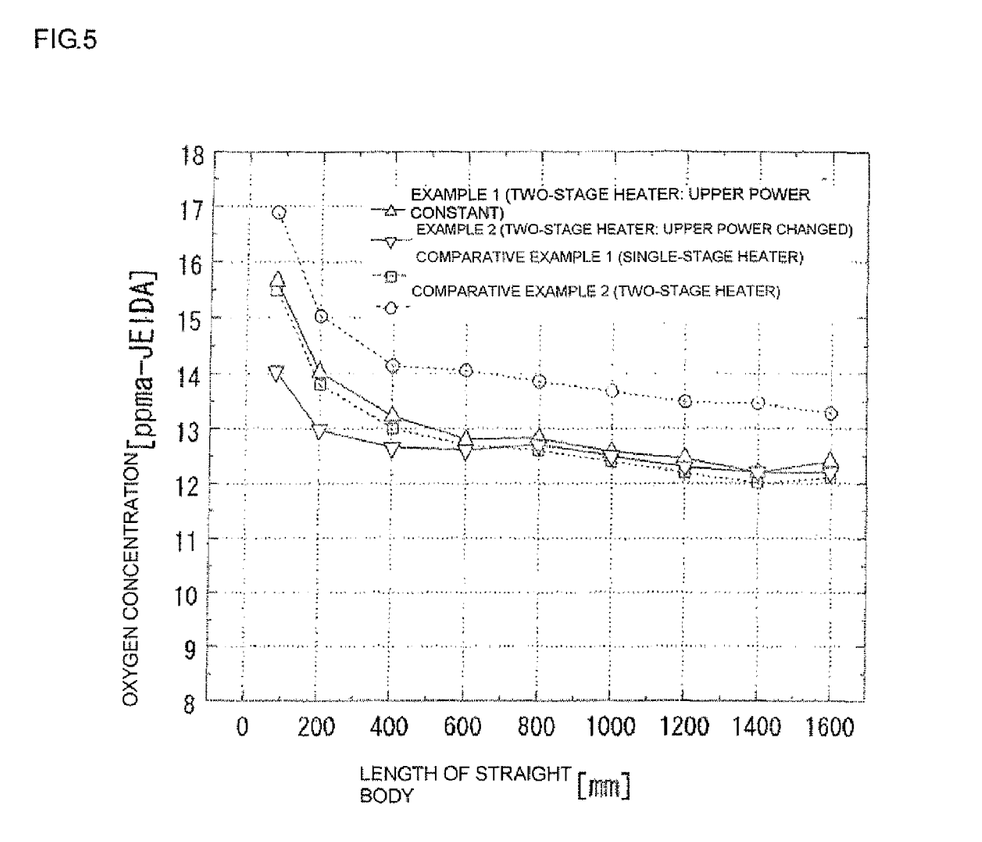
FIG. 5 is a diagram showing the length of a straight body and the oxygen concentration in a single crystal in examples and comparative examples.

Here, FIG. 5 is a diagram showing the length of a straight body and the oxygen concentration in a single crystal in the examples and the comparative examples. FIG. 6 is a diagram showing the length of a straight body and the power of the upper heater in the examples and the comparative examples. Moreover, FIG. 7 is data showing a region in a direction of the length of a straight body in which the entire plane has become an N region in Example 1, Example 2, and Comparative Example 1.

FIG. 5 shows that, in Example 1, the oxygen concentration can be controlled to be almost the same as the oxygen concentration of Comparative Example 1, and, unlike Comparative Example 2, the oxygen concentration does not increase. Moreover, in Example 2, the oxygen concentration in the former half of the straight body is lower than those of Comparative Example 1 and Example 1, and can be controlled to be more constant.

Figure 7:
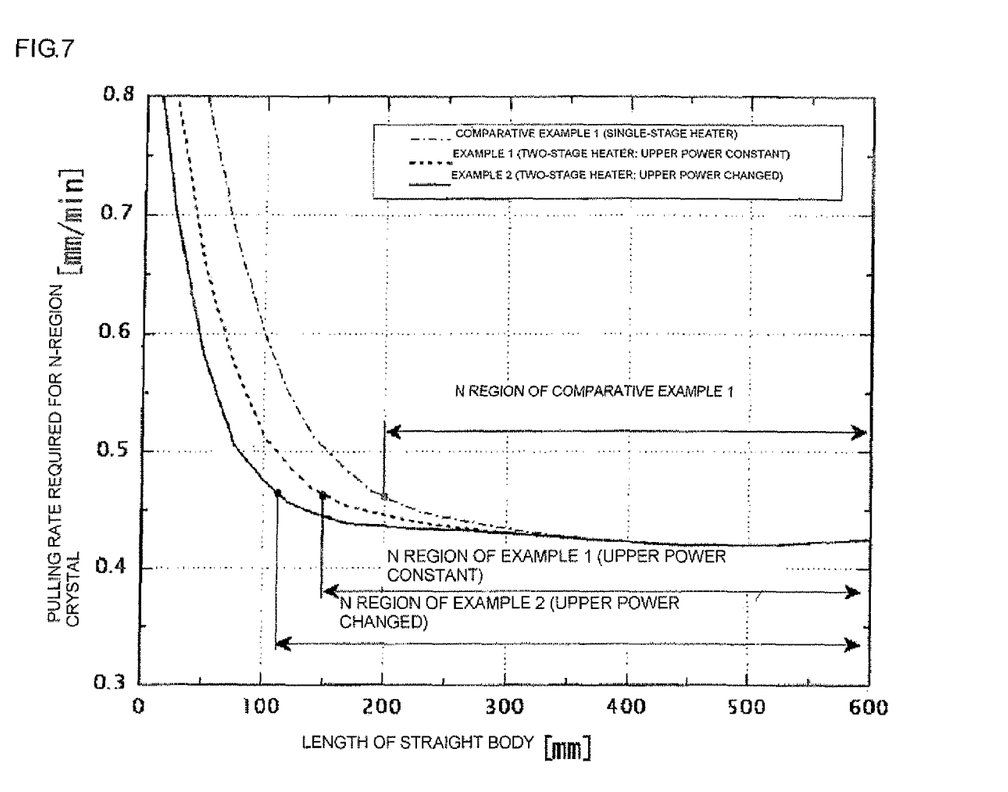
FIG. 7 is data showing a region in a direction of the length of a straight body in which the entire plane has become an N region in Example 1, Example 2, and Comparative Example 1.

Furthermore, as is clear from FIG. 7, in the growth of a single crystal by the two-stage heater of the present invention, the former half of the straight body has smaller G as compared to the growth of a single crystal by the conventional single-stage heater, and the pulling rate at which a region becomes an N region becomes stable from the former half of the straight body. This makes it possible to lengthen the length of a straight body in which the entire plane becomes an N region.

As described above, by using the upper heater of the present invention for use in the production of a single crystal, unlike the conventional two-stage heater, it is possible to prevent the oxygen concentration in the single crystal from increasing. Moreover, by pulling a single crystal upwardly while gradually reducing the power of the upper heater, it is possible to prevent an increase in the oxygen concentration of the former half of the straight body and at the same time obtain a single crystal with an intended crystal defect.

As described above, with the upper heater of the present invention for use in the production of a single crystal, it is possible to provide an upper heater for use in the production of a single crystal, the upper heater which can control a crystal defect of a single crystal efficiently. In addition, with the single crystal production equipment of the present invention, it is possible to control a crystal defect efficiently, improve oxygen concentration controllability, and provide a method for producing a single crystal, the method which produces a high-quality single crystal by using the single crystal production equipment.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

The invention claimed is:

1. An upper heater configured to produce a single crystal, the upper heater comprising:
   electrodes to which a current is supplied; and
   a heat generating section which generates heat by resistance heating, the upper heater being configured to produce a single crystal by a Czochralski method, the upper heater being placed above a graphite heater which surrounds a crucible containing silicon melt, wherein
   the heat generating section is ring-shaped, surrounds the crucible, and has slits that partially extend from either an inside or an outside of the heat generating section in a horizontal direction, and
   a width of the slits extending from the inside of the heat generating section is different from a width of the slits extending from the outside of the heat generating section to make a heat generation distribution of the heat generating section have an intended value.

2. The upper heater according to claim 1, wherein
   the upper heater has, in addition to the electrodes, dummy electrodes that support the heat generating section of the upper heater from below, the dummy electrodes each being placed in a position at an angle of 90 degrees from the electrodes in a circumferential direction.

3. The upper heater according to claim 1, wherein
   the heat generating section is formed of a carbon fiber composite material.

4. The upper heater according to claim 2, wherein
   the heat generating section is formed of a carbon fiber composite material.

5. A single crystal production apparatus, comprising:
   the upper heater according to claim 1.

6. A single crystal production apparatus, comprising:
   an upper heater configured to produce a single crystal, the upper heater comprising:
   electrodes to which a current is supplied; and
   a heat generating section which generates heat by resistance heating, the upper heater being configured to produce a single crystal by a Czochralski method, the upper heater being placed above a graphite heater which surrounds a crucible containing silicon melt, wherein
   the heat generating section is ring-shaped, surrounds the crucible, and has slits that partially extend from either an inside or an outside of the heat generating section in a horizontal direction,
   the upper heater has, in addition to the electrodes, dummy electrodes that support the heat generating section of the upper heater from below, the dummy electrodes each being placed in a position at an angle of 90 degrees from the electrodes in a circumferential direction,
   the heat generating section is formed of a carbon fiber composite material,
   a width of the slits extending from the inside of the heat generating section is different from a width of the slits extending from the outside of the heat generating section to make a heat generation distribution of the heat generating section have an intended value, and
   the electrodes of the upper heater to which a current is supplied are placed in vertical positions with respect to a direction of a magnetic line connecting coil's centers of a horizontal magnetic field applied from a magnetic field applying apparatus that is used during production of the single crystal by a horizontal magnetic field applying CZ method which pulls a single crystal upwardly while applying the horizontal magnetic field to the silicon melt by the magnetic field applying apparatus, and the polarities of the electrodes are configured such that the upper heater experiences downward forces from the horizontal magnetic field.

7. The single crystal production apparatus according to claim 5, further comprising:
   a crucible containing the silicon melt;
   a cooling cylinder cooling a single crystal pulled upwardly from the crucible; and
   a thermal shield which keeps the heat on a surface of the silicon melt and faces the silicon melt, the thermal shield being placed outside a lower end of a graphite cylinder provided in a lower part of the cooling cylinder, wherein
   the upper heater is placed in such a way that a bottom face of the upper heater is above the surface of the silicon melt during the growth of the single crystal and a top face of the upper heater is below a bottom of the thermal shield.

8. The single crystal production apparatus according to claim 6, further comprising:
   a crucible containing the silicon melt;
   a cooling cylinder cooling a single crystal pulled upwardly from the crucible; and
   a thermal shield which keeps the heat on a surface of the silicon melt and faces the silicon melt, the thermal shield being placed outside a lower end of a graphite cylinder provided in a lower part of the cooling cylinder, wherein
   the upper heater is placed in such a way that a bottom face of the upper heater is above the surface of the silicon melt during the growth of the single crystal and a top face of the upper heater is below a bottom of the thermal shield.

9. The single crystal production apparatus according to claim 5, further comprising:
   a magnetic field generating apparatus applying a horizontal magnetic field to the silicon melt, wherein
   the single crystal production apparatus produces a single crystal by a horizontal magnetic field applying CZ method, which pulls the single crystal upwardly while applying the horizontal magnetic field by the magnetic field generating apparatus.

10. The single crystal production apparatus according to claim 8, further comprising:
    a magnetic field generating apparatus applying a horizontal magnetic field to the silicon melt, wherein
    the single crystal production apparatus produces a single crystal by the horizontal magnetic field applying CZ method, which pulls the single crystal upwardly while applying the horizontal magnetic field by the magnetic field generating apparatus.

11. A method for producing a single crystal, wherein
    the single crystal is produced by the Czochralski method by using the single crystal production apparatus according to claim 5.

12. A method for producing a single crystal, wherein
    the single crystal is produced by the Czochralski method by using the single crystal production apparatus according to claim 6.

13. A method for producing a single crystal, the method comprising:
    producing the single crystal by the Czochralski method with the single crystal production apparatus according to claim 7, wherein
    a straight body of the single crystal with a constant diameter is formed by pulling the single crystal upwardly, and then power of the upper heater is gradually reduced until an upper part of the straight body reaches a lower end part of the cooling cylinder.

14. A method for producing a single crystal, the method comprising:
    producing the single crystal by the Czochralski method with the single crystal production apparatus according to claim 8, wherein
    a straight body of the single crystal with a constant diameter is formed by pulling the single crystal upwardly, and then power of the upper heater is gradually reduced until an upper part of the straight body reaches a lower end part of the cooling cylinder.

15. A method for producing a single crystal, the method comprising:
    producing the single crystal by the Czochralski method with the single crystal production apparatus according to claim 9, wherein
    a straight body of the single crystal with a constant diameter is formed by pulling the single crystal upwardly, and then power of the upper heater is gradually reduced until an upper part of the straight body reaches a lower end part of a cooling cylinder.

16. A method for producing a single crystal, the method comprising:
    producing the single crystal by the Czochralski method with the single crystal production apparatus according to claim 10, wherein
    a straight body of the single crystal with a constant diameter is formed by pulling the single crystal upwardly, and then power of the upper heater is gradually reduced until an upper part of the straight body reaches a lower end part of the cooling cylinder.

* * * * *